United States Patent
Yokoyama

(10) Patent No.: US 6,911,960 B1
(45) Date of Patent: Jun. 28, 2005

(54) ACTIVE-TYPE ELECTROLUMINESCENT DISPLAY

(75) Inventor: Ryoichi Yokoyama, Ohgaki (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/450,491

(22) Filed: Nov. 29, 1999

(30) Foreign Application Priority Data

Nov. 30, 1998 (JP) .......................................... 10-340501

(51) Int. Cl.[7] .............................................. G09G 3/30
(52) U.S. Cl. ............................ 345/76; 345/45; 345/80; 345/81; 345/85; 345/87; 345/92; 313/491; 313/505; 313/506; 257/83; 257/84; 257/88; 257/103
(58) Field of Search ........................... 345/45, 80, 85, 345/87, 92, 76, 81; 313/505, 491, 506; 257/83, 84, 88, 103

(56) References Cited

U.S. PATENT DOCUMENTS

| | | | | |
|---|---|---|---|---|
| 4,297,004 A | * | 10/1981 | Nishimura et al. | 349/138 |
| 5,034,341 A | * | 7/1991 | Itoh | 438/242 |
| 5,133,036 A | * | 7/1992 | Tornqvist | 385/130 |
| 5,223,961 A | * | 6/1993 | Ukai et al. | 349/55 |
| 5,321,536 A | * | 6/1994 | Ishii et al. | 359/72 |
| 5,598,059 A | * | 1/1997 | Sun et al. | 313/509 |
| 5,684,365 A | | 11/1997 | Tang et al. | |
| 5,710,454 A | * | 1/1998 | Wu | 257/413 |
| 5,767,623 A | * | 6/1998 | Friedman et al. | 313/509 |
| 5,821,688 A | * | 10/1998 | Shanks et al. | 313/498 |
| 5,831,699 A | * | 11/1998 | Wright et al. | 345/82 |
| 5,929,948 A | | 7/1999 | Ohori et al. | |
| 6,125,027 A | * | 9/2000 | Klee et al. | 361/320 |
| 6,137,819 A | * | 10/2000 | Najda | 372/96 |
| 6,146,928 A | * | 11/2000 | Ishiguro et al. | 438/151 |
| 6,198,517 B1 | | 3/2001 | Ohori et al. | |
| 6,333,522 B1 | * | 12/2001 | Inoue et al. | 257/99 |
| 6,361,885 B1 | * | 3/2002 | Chou | 428/690 |
| 6,689,492 B1 | * | 2/2004 | Yamazaki et al. | 428/690 |

FOREIGN PATENT DOCUMENTS

| | | |
|---|---|---|
| JP | 8-234683 | 9/1996 |
| JP | 9-230362 | 9/1997 |
| JP | 10-240149 | 9/1998 |

* cited by examiner

*Primary Examiner*—Xiao Wu
*Assistant Examiner*—Abbas Abdulselam
(74) *Attorney, Agent, or Firm*—Cantor Colburn LLP

(57) ABSTRACT

In an active-type electroluminescent (EL) display, a conductor interconnecting a cathode (55) of an EL panel (30, 40) and a connection terminal of a signal input substrate (35) has a multilayer structure formed of a cathode material and a conductive material used in a thin-film transistor forming step. The conductor may be formed of a conductive material used in a thin film transistor forming step. A metal material for a gate electrode or drain electrode is preferably used as the conductive material. The connection conductor structure can reduce the electrical resistance of the connection conductor, thus preventing a decrease in display intensity of an EL display.

18 Claims, 4 Drawing Sheets

ACTIVE-TYPE ELECTROLUMINESCENT DISPLAY

BACKGROUND OF THE INVENTION

1. Field of the Invention

The present invention relates to an active-type display wherein luminescent elements, e.g. electroluminescent (EL) elements or fluorescent elements are driven with thin film transistors (TFTs).

2. Description of Related Art

Organic EL elements are self-emitting displays. The organic EL element does not require any backlight indispensable for liquid-crystal displays and is suitable for thinning the display structure. Since the viewing angle of the organic EL element is not limited, the organic EL element has been highly expected to be put to practical use as the next-generation display.

In order to form an organic EL panel 1, as shown in FIG. 1, an anode electrode 3 formed of e.g. an ITO transparent electrode is formed on a transparent glass substrate 2. A hole-transport layer 5 of MTDATA (4,4'-bis(3-methylphenylphenylamino)biphenyl), an emissive layer 6 of TPD (4,4',4"-tris(3-methylphenylphenylamino) triphenylanine) and Rubrene, and an electron-transport layer 7 of $Alq_3$ are sequentially deposited between the anode electrode 3 and a cathode electrode 4 of MgIn alloy. When holes injected from the anode electrode 3 and electrons injected from the cathode electrode 4 are recombined within the emissive layer 6, light is emitted out from the transparent anode.

The display which drives the organic EL elements is classified into two types: a passive type using a passive matrix and an active type using TFTS. The schematic configuration of the passive type display is shown in FIG. 2.

A pair of electrodes in an EL element includes an anode electrode 3 in column and a cathode electrode 4 in row. Anode electrodes and cathode electrodes are arranged in a matrix. A row driver 8 supplies scanning signals ROW1, ROW2, ROW3, . . . to the cathode electrodes 4 respectively to select one of plural rows. The column driver 9 receives gray scale (tone) data representing a display gray scale of each pixel and then outputs pulse signals with a pulse width corresponding to the gray scale data, as column drive signals COL1, COL2, COL3, . . . , COLm. Thus, the EL elements emit light, corresponding to pixels PX1, PX2, PX3, . . . , PXm to which scanning signals and column drive signals are supplied.

Usually, in order to apply a predetermined positive voltage to the anode electrodes and to apply the ground potential or negative voltage to the cathode electrodes, a signal input substrate 10 such as TAB or FPC is connected to the organic EL panel 1. As shown in FIG. 1, copper connection terminals 11 are formed on the back surface of the signal input substrate 10 to supply predetermined voltages to the corresponding cathode electrodes. Conventionally, to connect the connection terminal 11 to the corresponding cathode electrode 4, a cathode material is extended to the connection terminal without any change.

In the passive-type display, electrons from EL elements corresponding to all pixels in the same column sink into the cathode electrodes. In the active-type display using TFT transistors, a sole cathode electrode is formed as a common electrode over the whole of the panel display area. All currents, which are emitted from EL elements corresponding to all pixels within a display area, are sank into the cathode. This current value becomes very large. Hence, like the conventional passive-type display, if the cathode material, in the active-type display, is extended from the cathode electrode to the panel terminal, as the connection conductor to the connection terminal of the signal input substrate, the connection conductor is narrowed significantly, compared with the cathode electrode. As a result, a large current from the cathode electrode becomes concentrated in the connection conductor. The cathode electrode made of Mg alloy has a relatively large resistance value. The large resistance component of the connection conductor causes a large voltage drop, thus decreasing the intensity of an EL element. This problem becomes more serious as the display screen is enlarged.

SUMMARY OF THE INVENTION

This invention is made to overcome the above-mentioned problems. It is an object of the present invention to provide a luminescent display which has connecting conductors of a reduced resistance value, thus providing an improved luminous intensity.

In one aspect of the present invention, an active-type light emission display comprises a light emission panel including light emission elements each having a first electrode, a second electrode, and an emissive portion, and thin-film transistors for respectively driving the light emission elements; and connection conductors each for connecting the second electrode and a signal supply portion, the signal supply portion supplying signals to the second electrode. The connection conductors each have a section between the second electrode and the signal supply unit. At least a part of the section is a multilayer structure formed of a second electrode material used for the second electrode and an conductive material used for the thin film transistors.

The multilayer structure of the connection conductor allows the cross section thereof to be substantially increased, without spreading the horizontal area of the connection conductor, thus decreasing the electrical resistance value. The lowered conductor resistance enables a small drop in a signal voltage applied to the second electrode. The signal can be effectively applied to the cathode so that a light emission element, for instance, an EL element, can be made to emit light at a high intensity.

In another aspect of the invention, the connection conductor does not have a multilayer structure formed with the second electrode. Instead, in the connection conductor, at least a part of the section between the second electrode and the signal supply portion is formed using only the conductive material for thin film transistors.

The conductive material used for the thin film transistor is, for example, a material used for the gate electrode, the drain electrode, and the source electrode of a transistor, generally, a low resistance material. Using the conductive material as a connection conductor material allows the electrical resistance of the connection conductor to be sufficiently reduced, so that the EL element can be made to emit light at a high intensity.

In another aspect of the present invention, the conductive material used for thin film transistors and connection conductors comprises a material used for a gate electrode, a drain electrode, or a source electrode of each of the thin film transistors, or comprises an arbitrary combination of materials used for the gate electrode, the drain electrode and the source electrode thereof.

The conductive material used for the thin film transistors and the connection conductors comprises a metal material used for a gate electrode or drain electrode of each of the thin film transistors.

The conductor resistance can be sufficiently lowered by using a low resistance material, such as a metal used for electrodes of a thin film transistor, as the material for the connection conductor (including a multilayer structure laminated with a second electrode material).

Furthermore, either a multilayer structure of a second electrode material and a conductive material for a thin film transistor or a conductive material used for a thin film transistor is used as the connection conductor. Thus, the connection conductor can be formed at the same time in the thin film transistor and/or cathode forming steps. Hence, a low resistance connection conductor can be obtained without adding a special step for the connection conductor.

In another aspect of the invention, the second electrode acts as a common electrode spreading all over the panel. Since the second electrode acting as a common electrode receives a large current, a large voltage drop fixed as the product of the conductor resistance and above large current arises so that the intensity of the light emission decreases. However, the above-mentioned multilayer structure can reduce the conductor resistance.

In yet another aspect of the present invention, the light emission element comprises an electroluminescent element in which an emissive layer is interposed between the first electrode and the second electrode. The emissive layer includes an organic compound with a luminous function. That is, the present invention is applicable to organic EL elements. In a current drive-type organic EL element, the present invention can reduce the resistance of the connection conductor which connects the cathode into which a large current is sunk and a signal supply portion for supplying signals to the cathode electrode. For that reason, the organic EL element can emit light at a high intensity.

In another aspect of the invention, the active layer of a thin film transistor comprises a polycrystalline silicon film. The polycrystalline silicon film improves the operational rate of a thin film transistor and allows a thin film transistor to be fabricated in a small area. As a result, a high-resolution display, for instance, EL display, vacuum fluorescent display (VFD), or field emission display (FED), can be obtained.

In still another aspect of the present invention, the signal supply portion comprises an external device connected to the light emission panel via the terminals. Generally, since the connection conductor connected to the external device is formed in as small an area as possible, the resistance value thereof tends to increase. Even in such a case, the present invention can sufficiently reduce the electrical resistance of the connection conductor.

BRIEF DESCRIPTION OF THE DRAWINGS

These and other objects, features, and advantages of the present invention will become more apparent upon a reading of the following detailed description and drawings, in which.

DESCRIPTION OF THE EMBODIMENTS

An EL display according to the present invention is an active-type EL display. The configuration of each pixel is shown in FIG. 3.

A pixel consists of an organic EL element 20, a first switching TFT 21, a capacitor 22, and a second TFT 23. The first TFT 21 is turned on/off by a selection signal Scan and a display signal Data is applied its drain. The capacitor 22 is electrically charged by the display signal Data supplied when the TFT 21 is turned on and holds the charged voltage Vh when the TFT 21 is turned off. The second TFT 23 has a drain connected to the drive power supply COM and a source connected to an anode electrode and drives the organic EL element 20 when the holding voltage vh of the capacitor 0.22 is applied to the gate.

When the TFT 21 is turned on with the selection signal Scan being at an H level during a selected horizontal scanning period (1H), the display signal Data is supplied to the capacitor 22. Thus, the capacitor 22 is charged to the voltage vh corresponding to the display signal Data. Even when the TFT 21 is turned off by the signal Scan being at an L level, the capacitor 22 continues to hold the voltage Vh during one vertical scanning period (1V). Since the voltage Vh is supplied to the gate of the TFT 23, the drive voltage $V_{COM}$ supplies power (current) according to the voltage Vh, to the EL element via the TFT 23. Thus, the EL element is controlled to emit light at an intensity corresponding to the supplied current.

Figure 1:
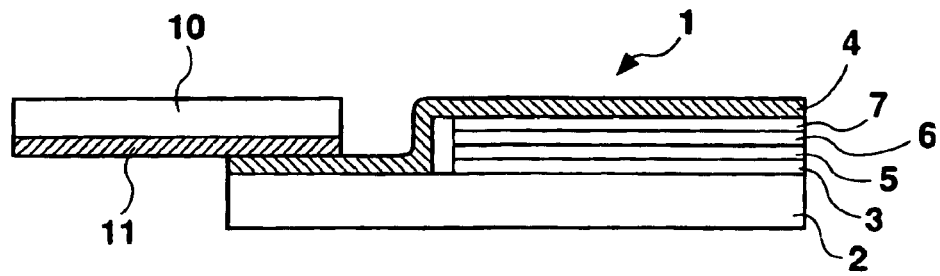
FIG. 1 is a cross-sectional view schematically illustrating a conventional passive-type EL display.
Figure 2:
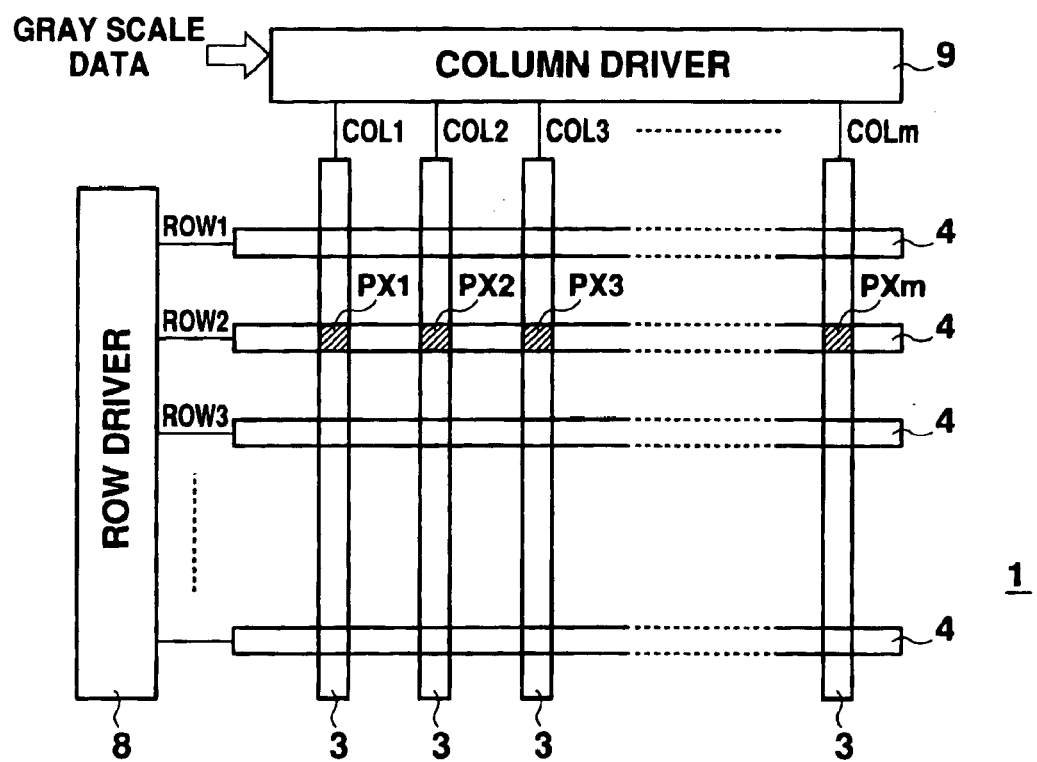
FIG. 2 is a schematic circuit configuration of a conventional passive-type EL display.
Figure 3:
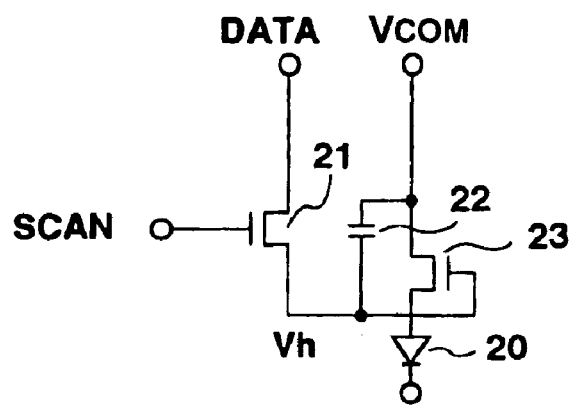
FIG. 3 is a circuit configuration for each pixel in an active-type EL display according to an embodiment of the present invention.
Figure 4:
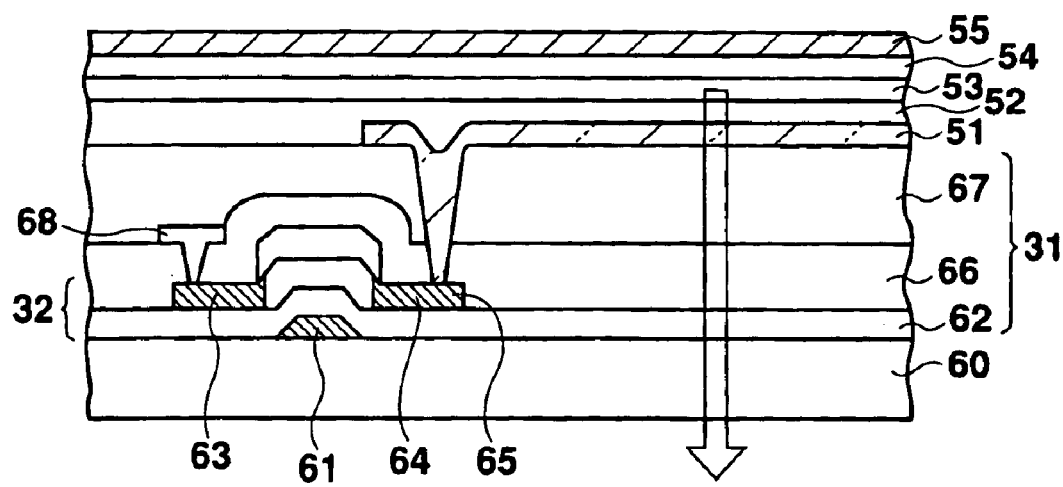
FIG. 4 is a cross-sectional view schematically illustrating a circuit configuration for each pixel in an active-type EL display according to an embodiment of the present invention.

FIG. 4 is a diagram illustrating the configuration including the organic EL element 20 and the TFT 23 in FIG. 3.

The organic EL element 20 is fabricated by sequentially laminating a hole-transport layer 52 including MTDATA, an emissive layer 53 including TPD and Rubrene, and an electron-transport layer 54 including $Alq_3$, between an anode 51 made of transparent ITO and a cathode 55 made of MgIn alloy. When holes injected from the anode 51 and electrons injected from the cathode 55 are recombined within the emissive layer 53, light is emitted. The light, shown with the arrow in FIG. 4, is emitted from the transparent anode. It should be noted that the material forming the organic EL element 20 is not limited only to that in the present embodiment.

The drive TFT 23 is fabricated by sequentially depositing a gate electrode 61 made of chromium Cr, a gate insulating film 62, a polycrystalline silicon film 65 including a drain region 63 and a source region 64, an interlayer insulating film 66, and a planarized insulating film 67, on a glass substrate 60. The drain region 63 is connected to the drain electrode 68 made of aluminum Al. The source region 64 is connected to the ITO 52 acting as the anode of the organic EL element 20 and forming the source electrode of the TFT 23. It should be noted that the switching transistor is not limited to only the TFT including the active layer made of the polycrystalline silicon film. For instance, the polycrystalline silicon film enables to fabricate high-speed, small TFTs, thus resulting in a high resolution display.

Figure 5:
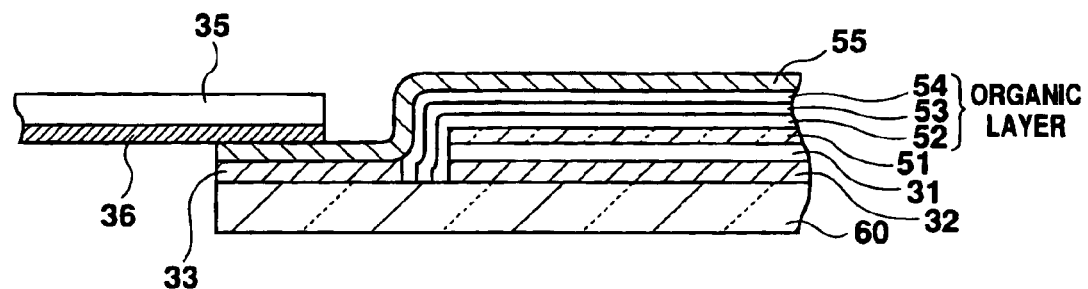
FIG. 5 is a cross-sectional view schematically illustrating an active-type EL display according to an embodiment of the present invention.
Figure 6:
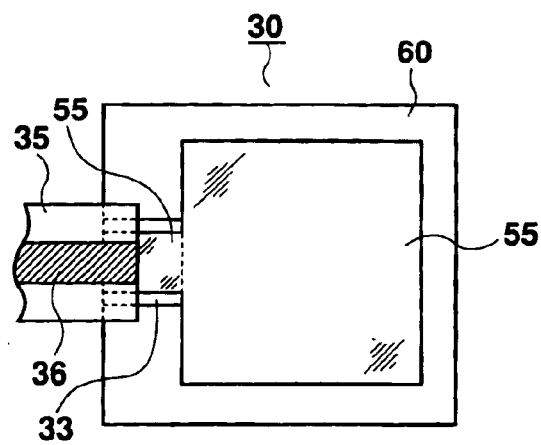
FIG. 6 is a plan view schematically illustrating an active-type EL display according to an embodiment of the present invention.

In the embodiment of the invention, the pixels are arranged in a matrix to fabricate an active-type EL panel 30. FIG. 5 shows the cross section of the connection between the panel 30 and the signal input substrate (TAB or FPC) 35. FIG. 6 shows the plan view of the same connection.

Referring to FIG. 5, the EL panel 30 is fabricated by sequentially laminating a hole-transport layer 52, an emissive layer 53, an electron-transport layer 54, and a cathode layer 55, on the ITO anode 51. The layer 31 corresponds to an insulating layer which includes a gate insulating film 62, an interlayer insulating film 66, and a planarized insulating film 67, formed on the substrate 60, shown in FIG. 4. Similarly, the layer 32 corresponds to a metal layer which includes a chromium Cr acting as the gate electrode and a metal layer made of aluminum Al, shown in FIG. 4. A connection terminal 36 is formed on the back surface of the signal input substrate 35 to supply a predetermined voltage to the cathode 55.

As shown in FIG. 6, the cathode 55 acts as a common electrode to all pixels extending over the whole display area. The multilayer structure formed of the cathode material layer 55 and the conductive material layer 33, shown in FIGS. 5 and 6, acts as a conductor line to connect the cathode 55 to the signal input terminal 36 of the signal input substrate 35. The conductive material used for the TFT 21 and/or 23 is used as the conductive material layer 33. More specifically, ITO is used for the source electrode (pixel electrode) 51 of a TFT and for the anode acting as the anode 51 of the EL element 20. Chromium Cr is used for the gate electrode 61. Aluminum Al is used for the drain electrode 68. Moreover, a combination of ITO, Chromium, and aluminum may be used for the conductive layer 33.

The conductive material used in the TFT fabrication process has a much low resistance value than cathode materials including MaIn alloy, MaAg alloy, and a laminated material of LiF and Al. Hence, these conductive materials can reduce the conductor resistance outside the display area, thus reducing a decrease in display intensity. Particularly, the metal materials such as chromium Cr, aluminum Al and the like, which have a considerably lower resistance than ITO, can provide significant effects. These materials, which are used in the ITO processing step, can be handled without increasing the number of steps.

In the above-mentioned embodiment, the multilayer structure made of the cathode material and the conductive material used in the TFT fabrication step is used as a conductor for connecting the cathode 55 to the connection terminal 36. Furthermore, another embodiment may have the following multilayer structure.

Figure 7:
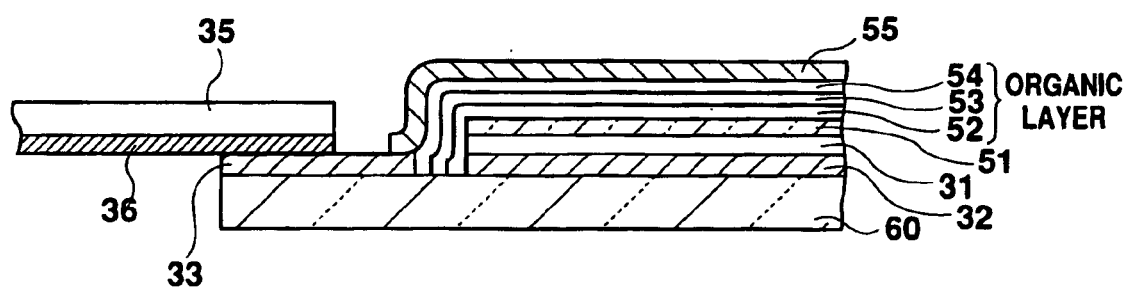
FIG. 7 is a cross-sectional view schematically illustrating an active-type EL display, different from that of FIG. 5, according to another embodiment of the present invention.
Figure 8:
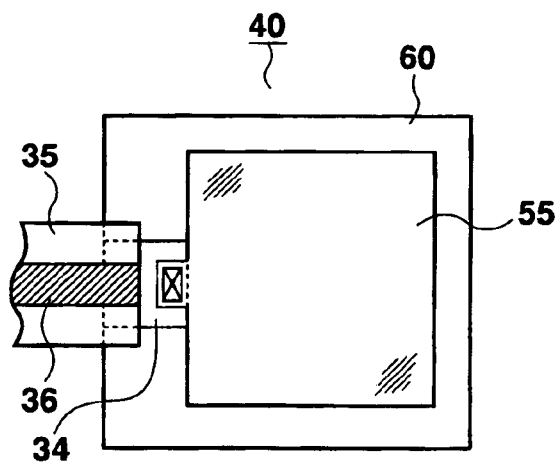
FIG. 8 is a plan view schematically illustrating an active-type EL display, different from that of FIG. 6, according to another embodiment of the present invention.

FIG. 7 is a cross sectional view illustrating a display panel according to another embodiment. FIG. 8 is a plan view illustrating the display panel shown in FIG. 7. The conductive material layer 34 is in contact with the cathode 55. The conductive material 34 is extended over the substrate 60 to form a conductor to the connection terminal 36. As described with the conductive material 33, the conductive material layer 34 is formed of either ITO, chromium Cr, or aluminum Al which are used for the source electrode (the anode of an EL element), the drain electrode, or the gate electrode of the TFT 21 or 23, or of a combination of them. Like the first embodiment, that structure can maintain the resistance of a conductor extending outside the display area at a low value. As a result, a decrease in display intensity can be suppressed. Particularly, metal materials including chromium Cr, aluminum Al, and the equivalents can effectively reduce the resistance component. In the TFT forming process, the conductive material layer 34 can be formed together with electrodes by performing photolithography so that a special step is not required and the connection terminal can be formed with a high precision.

In the active-type EL display according to the present invention, the resistance value of a connector lying outside the display area can be suppressed low so that a decrease in display intensity can be decreased.

In the organic EL element of the present invention wherein an organic compound is used for the emissive layer 53, the hole-transport layer 52, and the electron-transport layer 54, the organic compound layer usually has a dielectric property. Hence, when the connection conductor (cathode) disposed between the connection terminal 36 and the cathode, as shown in FIGS. 5 and 7, is formed on the side of an organic EL element, the connection conductor is electrically isolated from the anode 51 or the electrode layer 32 of a TFT. However, the method of electrically isolating the organic EL element from the connection conductor is not limited only to the above-mentioned method. Normally available isolating methods are also applicable for this invention.

The organic EL display adopting organic EL elements has been explained by referring to the above embodiments. However, it should be noted that the present invention is not limited only to the embodiments. The present invention is also applicable to light emission displays including vacuum fluorescent displays (VFD), field emission displays, and their equivalents. Thus, the above-mentioned technique can be adopted to reduce the resistance of the second electrode (e.g. cathode) conductor.

What is claimed is:

1. An active-type light emitting display comprising:
   a light emission panel including light emission elements each having a first electrode, a second electrode, and an emissive portion, and thin film transistors for respectively driving said light emission elements;
   said light emission elements and at least one of said thin film transistor are formed on or above a same substrate;
   said first electrode is electrically connected to at least one of said thin film transistors and is formed over an insulating layer, which is formed covering said at least one of said thin film transistors;
   said second electrode is formed in a pattern that is common for a plurality of pixels, above said first electrode;
   said thin film transistor includes a first conductive material that is formed between said substrate and said first electrode, said first conductive material is formed below said second electrode;
   a connection conductor for connecting said second electrode and a signal supply portion, said signal supply portion supplying a signal to said second electrode for controlling said second electrode separately from said first electrode; and
   said connection conductor having a section between said second electrode and said signal supply portion, at least a part of said section being a multilayer structure formed of a second electrode material used for said second electrode and a second conductive material, said first conductive material is the same material as said second conductive material, said multilayer structure having a resistance lower than a resistance of a single layer of said second electrode material.

2. The active-type light emission display defined in claim 1, wherein said conductive material used for said thin film transistors and said connection conductor comprises a material used for a gate electrode, a drain electrode, or a source electrode of each of said thin film transistors, or comprises an arbitrary combination of materials used for said gate electrode, said drain electrode and said source electrode thereof.

3. The active-type light emission display defined in claim 1, wherein said conductive material used for said thin film transistors and said connection conductor comprises a metal material used for a gate electrode or drain electrode of each of said thin film transistors.

4. The active-type light emission display defined in claim 1, wherein said second electrode comprises a common electrode spreading over substantially the whole of said panel.

5. The active-type light emission display defined in claim 1, wherein said light emission element comprises an electroluminescent element in which an emissive layer is interposed between said first electrode and said second electrode.

6. The active-type light emission display defined in claim 5, wherein said emissive layer comprises an organic compound having a luminous function.

7. The active-type light emission display defined in claim 1, wherein an active layer of each of said thin film transistors comprises a polycrystalline silicon layer.

8. The active-type light emissuion display defined in claim 1, wherein said signal supply portion comprises an external device connected to said light emission panel via terminals.

9. An active-type electroluminescent display comprising:
a light emission panel including light emission elements each having a first electrode, a second electrode, and a luminous portion, and thin film transistors for respectively driving said light emission elements;
said light emission elements and at least one of said thin film transistor are formed on or above a same substrate;
said first electrode is electrically connected to at least one of said thin film transistors and is formed over an insulating layer, which is formed covering said at least one of said thin film transistors;
said second electrode is formed in a pattern that is common for a plurality of pixels, above said first electrode;
said thin film transistor includes a first conductive material that is formed between said substrate and said first electrode, said first conductive material is formed below said second electrode;
a connection conductor for connecting said second electrode and a signal supply portion, said signal supply portion supplying a signal to said second electrode for controlling said second electrode separately from said first electrode; and
said connection conductor having a section between said second electrode and said signal supply portion, at least a part of said section being formed of a second conductive material, said first conductive material is the same material as said second conductive material, said part having a resistance lower than a resistance of a single layer of a material used for said second electrode.

10. The active-type electroluminescent display defined in claim 9, wherein said conductive material used for said thin film transistors and said connection conductor comprises a material used for a gate electrode, a drain electrode, or a source electrode of each of said thin film transistors, or comprises an arbitrary combination of materials used for said gate electrode, said drain electrode and said source electrode thereof.

11. The active-type electroluminescent display defined in claim 9, wherein said conductive material used for said thin film transistors and said connection conductor comprises a metal material used for a gate electrode or drain electrode of each of said thin film transistors.

12. The active-type electroluminescent display defined in claim 9, wherein said second electrode comprises a common electrode spreading over substantially the whole of said panel.

13. The active-type electroluminescent display defined in claim 9, wherein said light emission element comprises an electroluminiscent element in which an emissive layer is interposed between said first electrode and said second electrode.

14. The active-type electroluminiscent display defined in claim 13, wherein said emissive layer comprises an organic compound having a luminous function.

15. The active-type electroluminiscent display defined in claim 9, wherein an active layer of each of said thin film transistors comprises a polycrystalline silicon layer.

16. The active-type electroluminscent display defined in claim 9, wherein said signal supply portion comprises an external device connected to said light emission panel via terminals.

17. An active-type light emitting display comprising:
a light emission panel including light emission element each having a first electrode, a second electrode, and an emissive portion, and thin film transistors for respectively driving said light emission elements;
said light emission elements and at least one of said thin film transistor are formed on or above a same substrate;
said first electrode is electrically connected to at least one of said thin film transistors and is formed over an insulating layer, which is formed covering said at least one of said thin film transistors;
said second electrode is formed in a pattern that is common for a plurality of pixels, above said first electrode; and
said thin film transistor includes a first conductive material that is formed between said substrate and said first electrode, said first conductive material is formed below said second electrode;
a connection conductor for connecting said second electrode and a signal supply portion, said signal supply portion supplying a signal to said second electrode for controlling said second electrode separately from said first electrode;
said connection conductor having a section between said second electrode and said signal supply portion, at least a part of said section being a multilayer structure formed of a second electrode material used for said second electrode and a second conductive material, said first conductive material is the same material as said second conductive material, said multilayer structure having a resistance lower than a resistance of a single layer of said second electrode material.

18. An active-type electroluminescent display comprising:
- a light emission panel including light emission elements each having a first electrode, a second electrode, and a luminous portion, and thin film transistors for respectively driving said light emission elements;
- said light emission elements and at least one of said thin film transistor are formed on or above a same substrate;
- said first electrode is electrically connected to at least one of said thin film transistors and is formed over an insulating layer, which is formed covering said at least one of said thin film transistors;
- said second electrode is formed in a pattern that is common for a plurality of pixels above said first electrode;
- said thin film transistor includes a first conductive material that is formed between said substrate and said first electrode, said first conductive material is formed below said second electrode;
- a connection conductor for connecting said second electrode and a signal supply portion, said signal supply portion supplying a signal to said second electrode for controlling said second electrode separately from said first electrode; and
- said connection conductor having a section between said second electrode and said signal supply portion, at least a part of said section being formed of a second conductive material, said first conductive material is the same material as said second conductive material, said part having a resistance lower than a resistance of a single layer of a material used for said second electrode.

* * * * *